US012619155B2

(12) United States Patent
Yoshida et al.

(10) Patent No.: US 12,619,155 B2
(45) Date of Patent: May 5, 2026

(54) METHOD FOR PRODUCING PRINTING PLATE AND PRINTING METHOD

(71) Applicant: ASAHI KASEI KABUSHIKI KAISHA, Tokyo (JP)

(72) Inventors: Yuka Yoshida, Tokyo (JP); Takumi Ishii, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 12 days.

(21) Appl. No.: 18/686,905

(22) PCT Filed: Sep. 9, 2022

(86) PCT No.: PCT/JP2022/033844
§ 371 (c)(1),
(2) Date: Feb. 27, 2024

(87) PCT Pub. No.: WO2023/058406
PCT Pub. Date: Apr. 13, 2023

(65) Prior Publication Data
US 2024/0361700 A1 Oct. 31, 2024

(30) Foreign Application Priority Data
Oct. 6, 2021 (JP) ................................. 2021-164482

(51) Int. Cl.
| | |
|---|---|
| *G03F 7/40* | (2006.01) |
| *B41M 1/04* | (2006.01) |
| *G03F 7/00* | (2006.01) |
| *G03F 7/20* | (2006.01) |

(52) U.S. Cl.
CPC ................. *G03F 7/40* (2013.01); *B41M 1/04* (2013.01); *G03F 7/0035* (2013.01); *G03F 7/2002* (2013.01)

(58) Field of Classification Search
CPC ........................................................ G03F 7/40
See application file for complete search history.

(56) References Cited

U.S. PATENT DOCUMENTS

| | | | | |
|---|---|---|---|---|
| 5,175,072 A | * | 12/1992 | Martens ..................... | G03F 7/36 430/296 |
| 5,322,761 A | * | 6/1994 | Kausch ................... | G03F 7/093 430/300 |

| | | | |
|---|---|---|---|
| 2003/0211423 A1 | 11/2003 | Mengel et al. | |
| 2004/0048199 A1 | 3/2004 | Schadebrodt et al. | |
| 2005/0142494 A1 | 6/2005 | Hackler et al. | |
| 2007/0059642 A1 | 3/2007 | Dudek et al. | |
| 2008/0248428 A1 | 10/2008 | Teltschik et al. | |
| 2010/0112484 A1 | 5/2010 | Kato et al. | |
| 2010/0273108 A1 | 10/2010 | Yamada et al. | |
| 2013/0017502 A1 | 1/2013 | Baldwin et al. | |

FOREIGN PATENT DOCUMENTS

| | | | | |
|---|---|---|---|---|
| EP | 0 665 471 A2 | | 8/1995 | |
| JP | 5-19469 A | | 1/1993 | |
| JP | 7-234503 A | | 9/1995 | |
| JP | 3117749 B2 | | 12/2000 | |
| JP | 2003-533738 A | | 11/2003 | |
| JP | 2004-163863 A | | 6/2004 | |
| JP | 2007-86781 A | | 4/2007 | |
| JP | 2007-511791 A | | 5/2007 | |
| JP | 2009-109606 A | | 5/2009 | |
| JP | 2010-107981 A | | 5/2010 | |
| JP | 2012-78445 A | | 4/2012 | |
| JP | 2013156361 A | * | 8/2013 | |
| JP | 2014-524049 A | | 9/2014 | |
| JP | 5827746 B2 | | 12/2015 | |
| WO | 2009/075364 A1 | | 6/2009 | |

OTHER PUBLICATIONS

International Search Report issued in International Patent Application No. PCT/JP2022/033844, dated Nov. 29, 2022, along with an English translation thereof.
International Preliminary Report on Patentability issued in International Patent Application No. PCT/JP2022/033844, dated Apr. 9, 2024, along with English translation thereof.
European Search Report that issued in the corresponding European Patent Appl. No. 22878277.7, dated May 27, 2025.

* cited by examiner

*Primary Examiner* — Chanceity N Robinson
(74) *Attorney, Agent, or Firm* — Greenblum & Bernstein, P.L.C.

(57) ABSTRACT

A method for producing a printing plate, containing: an exposure step of forming a relief by the exposure of a photosensitive resin composition; and a developing step of performing development by attaching or adsorbing the photosensitive resin composition of an unexposed portion in the exposure step to a development medium, wherein a storage elastic modulus of the photosensitive resin composition of the unexposed portion at a development temperature of the developing step is 100 Pa or more and 4000 Pa or less, and the development medium is a wiper having an elastic recovery rate of 30% or more and 99% or less.

11 Claims, No Drawings

METHOD FOR PRODUCING PRINTING PLATE AND PRINTING METHOD

TECHNICAL FIELD

The present invention relates to a method for producing a printing plate and a printing method.

BACKGROUND ART

In recent years, flexographic printing has been widely used as a method for printing soft package materials such as paper or films. A plate material for letterpress printing typified by flexographic printing includes, for example, a photosensitive resin plate.

A method for producing a flexographic printing plate from such a photosensitive resin plate includes, for example, the following method.

First, the whole surface of a photosensitive resin composition layer is subjected to ultraviolet exposure (called back exposure) through a support to establish a uniform photo-cured layer. Next, relief exposure is performed from the back side, i.e., the uncured surface side of the photosensitive resin composition layer which is the side opposite to the ultraviolet exposed surface to obtain an original flexographic printing plate. Examples of a method for the relief exposure include a method of performing ultraviolet exposure via a transparent image carrier, such as a negative film, which permits selective transmission of an ultraviolet ray, and a method of performing ultraviolet exposure via a thin layer with an ultraviolet transmitting portion formed by infrared laser ablation based on an image as digital information. The photosensitive resin composition of the unexposed portion of the original flexographic printing plate is removed by washing with a developing solution, for example, so that a relief image is formed to obtain a flexographic printing plate.

Meanwhile, a developing step in a dry process which does not use a developing solution has been studied with growing environmental consciousness in recent years.

Among others, a heat development scheme, which performs development by heating an original flexographic printing plate after relief exposure to melt an unexposed portion, and removing the melted unexposed portion with a development medium such as a nonwoven fabric, permits development without the use of a solvent and has received attention.

A development method that exploits a heat development scheme has been proposed as the above-described developing step in a dry process which does not use a developing solution (see, for example, Patent Document 1). This development method has the advantage that, unlike conventional development methods using a developing solution, neither organic solvent wastes nor contaminated wastewater by-products are generated. This method also has the advantage that a drying treatment for a long time is not required after the development treatment.

On the other hand, problems of the heat development scheme compared with conventional development methods using a developing solution are poor developability and residues that tend to remain, because an uncured resin is not dissolved or dispersed in a solvent. Hence, the heat development scheme requires pressing an original flexographic printing plate hard or a plurality of times against a development medium such as a nonwoven fabric in order to enhance developability, and during this course, a plate thickness tends to be decreased. Furthermore, as the original flexographic printing plate has a larger size, the development medium is more difficult to press at a uniform pressure against the whole original flexographic printing plate and the thickness uniformity of a finally obtained flexographic printing plate is more easily impaired. This leads to a problem of easy occurrence of adverse effects such as deterioration in image uniformity at the time of printing. Particularly, the maintenance of thickness uniformity is a technical challenge to large-size flexographic printing plates which are increasingly demanded in recent years.

In light of the problems of the heat development scheme regarding image uniformity at the time of printing as described above, a technique of improving image uniformity at the time of printing using a flexographic printing plate by controlling the surface roughness of an original flexographic printing plate at the time of heat development has been proposed (see, for example, Patent Document 2).

CITATION LIST

Patent Document

Patent Document 1: Japanese Patent No. 3117749
Patent Document 2: Japanese Patent No. 5827746

SUMMARY OF INVENTION

Technical Problem

Although the technique proposed in Patent Document 2 controls the surface roughness of a flexographic printing plate, its problem is that the technique is still susceptible to improvement in the thickness uniformity of the flexographic printing plate.

In view of the above-described problems of the conventional techniques, an object of the present invention is to provide a method for producing a printing plate excellent in thickness uniformity in the case of using a development treatment in a dry process.

Solution to Problem

The present inventors have conducted diligent studies in order to solve the problems and have found that the above-described problems can be solved by combining a development medium having specific physical properties with a photosensitive resin composition in a development treatment in a dry process, and thereby completed the present invention.

That is, the present invention is as follows.

[1]

A method for producing a printing plate, containing:

an exposure step of forming a relief by the exposure of a photosensitive resin composition; and a developing step of performing development by attaching or adsorbing the photosensitive resin composition of an unexposed portion in the exposure step to a development medium, wherein a storage elastic modulus of the photosensitive resin composition of the unexposed portion at a development temperature of the developing step is 100 Pa or more and 4000 Pa or less, and the development medium is a wiper having an elastic recovery rate of 30% or more and 99% or less.

3

[2]

The method for producing a printing plate according to [1], wherein the storage elastic modulus of the photosensitive resin composition of the unexposed portion at the development temperature is 100 Pa or more and 350 Pa or less.

[3]

The method for producing a printing plate according to [1], wherein the storage elastic modulus of the photosensitive resin composition of the unexposed portion at the development temperature is 100 Pa or more and 250 Pa or less.

[4]

The method for producing a printing plate according to any one of [1] to [3], wherein a loss elastic modulus of the photosensitive resin composition of the unexposed portion at the development temperature is 90 Pa or more and 500 Pa or less.

[5]

The method for producing a printing plate according to any one of [1] to [4], wherein the development medium is a wiper having an elastic recovery rate of 35% or more and 99% or less.

[6]

The method for producing a printing plate according to any one of [1] to [5], wherein the development medium is a wiper having an elastic recovery rate of 40% or more and 99% or less.

[7]

The method for producing a printing plate according to any one of [1] to [6], wherein the development medium is a wiper having an elastic recovery rate of 60% or more and 99% or less.

[8]

The method for producing a printing plate according to any one of [1] to [7], wherein a relief depth of the printing plate is set to 0.1 mm or larger and 10.0 mm or smaller.

[9]

The method for producing a printing plate according to any one of [1] to [8], wherein the wiper is a nonwoven fabric.

[10]

The method for producing a printing plate according to any one of [1] to [9], further containing the step of recovering the photosensitive resin composition of the unexposed portion attached or adsorbed to the development medium as a photosensitive resin composition for the production of a new printing plate.

[11]

The method for producing a printing plate according to any one of [1] to [10], wherein the photosensitive resin composition of the unexposed portion attached or adsorbed to the development medium is recovered and used as a photosensitive resin composition for the production of a new printing plate.

[12]

A printing method containing:

the step of producing a printing plate by the method for producing a printing plate according to any one of [1] to [11]; and

a printing step of performing printing using the produced printing plate.

Advantageous Effect of Invention

The present invention can produce a printing plate excellent in thickness uniformity in the case of using a development treatment in a dry process.

DESCRIPTION OF EMBODIMENTS

Hereinafter, an embodiment for carrying out the present invention (hereinafter, referred to as "present embodiment") will be described in detail. However, the present embodiment given below is an illustration for describing the present invention and does not intend to limit the present invention to the contents given below.

The present invention can be carried out through appropriate changes or modifications without departing from the spirit of the present invention.

[Method for Producing Printing Plate]

The method for producing a printing plate according to the present embodiment contains:

an exposure step of forming a relief by the exposure of a photosensitive resin composition; and a developing step of performing development by attaching or adsorbing the photosensitive resin composition of an unexposed portion in the exposure step to a development medium, wherein a storage elastic modulus of the photosensitive resin composition of the unexposed portion at a development temperature of the developing step is 100 Pa or more and 4000 Pa or less, and the development medium is a wiper having an elastic recovery rate of 30% or more and 99% or less.

The printing plate obtained by the production method of the present embodiment is preferably a flexographic printing plate (letterpress printing plate).

In the method for producing a printing plate according to the present embodiment, the unexposed portion of the photosensitive resin composition in an original printing plate after the exposure step is removed using a development medium.

The unexposed portion is contacted with a wiper which is a development medium and thereby attached or adsorbed thereto and removed.

The method for producing a printing plate according to the present embodiment produces a printing plate excellent in thickness uniformity.

(Original Printing Plate)

In the method for producing a printing plate according to the present embodiment, an exposure step involves forming a relief by the exposure of a photosensitive resin composition layer to obtain an original printing plate, and a developing step involves attaching or adsorbing an unexposed portion of the photosensitive resin composition layer to a development medium for removal.

The original printing plate is configured to have at least a support (a) and a photosensitive resin composition layer (b) laminated on the support (a), before exposure of the photosensitive resin composition layer. In the present specification, such a configuration is also referred to as a "photosensitive resin structure for a printing plate".

That is, as described later, an original printing plate is prepared by forming a relief by the pattern exposure of the photosensitive resin structure for a printing plate, and a printing plate is obtained by melting and removing an unexposed portion from the original printing plate.

<Support (a)>

Examples of the support (a) include, but are not limited to, a polyester film, a polyamide film, a polyacrylonitrile film, and a polyvinyl chloride film.

Among these, the support (a) is preferably a polyester film.

Examples of the polyester used for the support (a) include, but are not limited to, polyethylene terephthalate, polybutylene terephthalate, and polyethylene naphthalate.

The thickness of the support (a) is not particularly limited, but is preferably 50 to 300 μm.

An adhesive layer may be provided on the support (a) in order to enhance the adhesive force between the support (a) and the photosensitive resin composition layer (b) which will be described later. Examples of the adhesive layer include, but are not particularly limited to, the adhesive layer described in International Publication No. WO 2004/104701, Japanese Patent No. 3094647, and Japanese Patent No. 2634429.

<Photosensitive Resin Composition Layer (b)>

The photosensitive resin structure for a printing plate has a photosensitive resin composition layer (b) on the support (a).

The photosensitive resin composition layer (b) may be laminated directly on the support (a), or may be indirectly laminated via the above-described adhesive layer or the like.

The photosensitive resin composition layer (b) is not particularly limited and contains, for example, a polymer (b-1) described later and may preferably further contain an ethylenically unsaturated compound (b-2) and a photopolymerization initiator (b-3).

The photosensitive resin composition layer (b) may further contain an auxiliary additive component which will be described later, if necessary.

Hereinafter, each component is described in detail.

[Polymer (b-1)]

The polymer (b-1) is not particularly limited, and, for example, a linear, branched, or dendritic polymer can be used. A homopolymer or a copolymer may be used. The copolymer may be a random copolymer, an alternating copolymer, or a block copolymer.

Suitable examples of the polymer (b-1) include a polymer conventionally used in the production of printing plates, such as completely or partially hydrolyzed polyvinyl ester, partially hydrolyzed polyvinyl acetate, a polyvinyl alcohol derivative, a partially hydrolyzed vinyl acetate/alkylene oxide graft copolymer, a partially hydrolyzed vinyl acetate/alkylene oxide graft copolymer which is polyvinyl alcohol subsequently acylated polymer-analogous reaction, polyamide, and mixtures thereof.

In addition to those described above, examples of the polymer (b-1) include a thermoplastic elastomer binder.

A thermoplastic elastomer block copolymer can be used as the thermoplastic elastomer. Examples of the thermoplastic elastomer block copolymer include a copolymer containing at least one block containing an alkenyl aromatic monomer unit and at least one block containing a 1,3-diene monomer unit. Examples of the alkenyl aromatic compound that forms the alkenyl aromatic monomer unit include styrene, α-methylstyrene, and vinyltoluene. Among these, styrene is preferably contained from the viewpoint of being capable of smoothly forming the photosensitive resin composition layer (b) at a relatively low temperature and improving surface thickness uniformity. Butadiene and/or isoprene is preferably contained as 1,3-diene from the viewpoint of reducing the steric hindrance of a vinyl group, enhancing photo-cross-linking efficiency, and preventing reduction in thickness uniformity caused by the breakage of a finally obtained printing plate.

Polyurethane is preferably contained as the polymer (b-1) from the viewpoint of preventing thickness uniformity from being reduced due to the abrasion of a printing plate when printing is performed for a long time. The polyurethane preferably has a (meth)acrylic group as a terminal group from the viewpoint of improving the mechanical physical properties of a finally obtained printing plate by photo-cross-linking, and preventing reduction in thickness uniformity caused by breakage or abrasion.

Examples of a method for producing the polyurethane having a (meth)acrylic group as a terminal group include a method of reacting diol having a repeat unit in the molecule with diisocyanate to form polyurethane having a terminal isocyanate group with an arbitrary molecular weight, and subsequently reacting the polyurethane with a compound having active hydrogen and a (meth)acrylic group in one molecule. Another example thereof includes a method of reacting diol having a repeat unit in the molecule with diisocyanate to form polyurethane having a terminal isocyanate group with an arbitrary molecular weight, and subsequently reacting the polyurethane with a compound having a hydroxy group and a (meth)acrylic group in one molecule.

The polyurethane structure obtained by the production method described above is a structure constructed through the reaction of diol having a repeat unit in the molecule with diisocyanate.

Hereinafter, the "polyurethane having a (meth)acrylic group as a terminal group" synthesized by the method described above is referred to as an "unsaturated prepolymer".

Examples of the "diol having a repeat unit in the molecule" for use in the production of the unsaturated prepolymer include, but are not limited to, polyester diol consisting of dicarboxylic acid and diol, polyether diol, polyether/polyester copolymer diol, and a 1,2-polybutadiene compound having a terminal hydroxy group. The diol having a repeat unit in the molecule may be used singly or can be used in combinations of two or more thereof.

Examples of the dicarboxylic acid constituting the polyester diol include, but are not limited to, succinic acid, glutaric acid, adipic acid, pimelic acid, suberic acid, azelaic acid, sebacic acid, maleic acid, terephthalic acid, isophthalic acid and 1,5-naphthalenedicarboxylic acid.

Examples of the diol constituting the polyester diol include, but are not limited to, 1,4-butanediol, 2-methyl-1,3-propanediol, 3-methyl-1,5-pentanediol, neopentyldiol, 1,6-hexanediol, 1,9-nonanediol, 2-methyl-1,8-octanediol, and diethylene glycol (dioxyethylenediol).

Examples of the polyether diol include, but are not limited to, polyoxyethylenediol, polyoxypropylenediol, polyoxytetramethylenediol, polyoxy-1,2-butylenediol, polyoxyethylene/polyoxypropylene random copolymer diol, polyoxyethylene/polyoxypropylene block copolymer diol, polyoxyethylene/polyoxytetramethylene random copolymer diol, and polyoxyethylene/polyoxytetramethylene block copolymer diol.

Examples of the polyether/polyester copolymer polyol include, but are not limited to, a copolymer having a structure where the repeat unit that forms the molecular chain of the above-described polyether polyol and the repeat unit that forms the molecular chain of the above-described polyester polyol are linked in a block or random pattern.

The 1,2-polybutadiene compound having a terminal hydroxy group may be a hydrogenated compound. Examples of the 1,2-polybutadiene compound having a terminal hydroxy group include, but are not limited to, poly-1-butene hydride and 1,2-polybutadiene hydride. The number of terminal hydroxy groups is not particularly limited and is preferably 1.2 or more and 2.0 or less, and more preferably 1.5 or more and 2.0 or less per molecule from the viewpoint of maintaining the thickness uniformity of a finally obtained flexographic printing plate.

Examples of the diisocyanate include, but are not limited to, tolylene diisocyanate, xylylene diisocyanate, hexamethylene diisocyanate, trimethylhexamethylene diisocyanate, isophorone diisocyanate, diphenylmethane diisocyanate, cyclohexane diisocyanate, dicyclohexylmethane diisocyanate, and norbornene diisocyanate.

The diisocyanate is used singly or in combinations of two or more thereof.

The content of the polymer (b-1) in the photosensitive resin composition layer (b) is preferably 20% by mass or more, more preferably 40% by mass or more and 90% by mass or less, further preferably 50% by mass or more and 90% by mass or less, and further more preferably 60% by mass or more and 80% by mass or less when the whole amount of the photosensitive resin composition layer (b) is assumed to be 100% by mass from the viewpoint of controlling the storage elastic modulus and/or the loss elastic modulus of the photosensitive resin composition to an appropriate numeric range.

[Ethylenically Unsaturated Compound (b-2)]

The photosensitive resin composition layer (b) preferably contains an ethylenically unsaturated compound (b-2), as described above. The ethylenically unsaturated compound (b-2) is a compound having a radically polymerizable unsaturated double bond.

Examples of the ethylenically unsaturated compound (b-2) include, but are not limited to, olefins such as ethylene, propylene, vinyltoluene, styrene, and divinylbenzene; acetylenes; (meth)acrylic acid and/or derivatives thereof; haloolefins; unsaturated nitriles such as acrylonitrile; unsaturated amides such as acrylamide or methacrylamide, and derivatives thereof; unsaturated dicarboxylic acids and derivatives thereof such as maleic anhydride, maleic acid, and fumaric acid; vinyl acetates; N-vinylpyrrolidone; N-vinylcarbazole; and N-substituted maleimide compounds.

Among these, the ethylenically unsaturated compound (b-2) is preferably (meth)acrylic acid and/or a derivative thereof from the viewpoint of improving ultraviolet ray curability and printing durability of the photosensitive resin composition layer (b) after curing, and maintaining thickness uniformity.

Examples of each of the derivatives include, but are not limited to, an alicyclic compound having a cycloalkyl group, a bicycloalkyl group, a cycloalkenyl group, a bicycloalkenyl group, or the like; an aromatic compound having a benzyl group, a phenyl group, a phenoxy group, a naphthalene skeleton, an anthracene skeleton, a biphenyl skeleton, a phenanthrene skeleton, a fluorene skeleton, or the like; a compound having an alkyl group, a halogenated alkyl group, an alkoxyalkyl group, a hydroxyalkyl group, an aminoalkyl group, a glycidyl group, or the like; an ester compound with a polyhydric alcohol such as an alkylene glycol, a polyoxyalkylene glycol, a polyalkylene glycol, or trimethylolpropane; and a compound having a polysiloxane structure, such as polydimethylsiloxane and polydiethylsiloxane.

In addition, the ethylenically unsaturated compound (b-2) may be a heteroaromatic compound containing an element such as nitrogen or sulfur.

Examples of the (meth)acrylic acid and/or derivatives thereof include, but are not limited to, a diacrylate and a dimethacrylate of an alkanediol such as hexanediol or nonanediol; a diacrylate and a dimethacrylate of a glycol such as ethylene glycol, diethylene glycol, propylene glycol, dipropylene glycol, polyethylene glycol, or butylene glycol; trimethylolpropane tri(meth)acrylate; dimethylol tricyclodecane di(meth)acrylate; isobornyl (meth)acylate; phenoxy polyethylene glycol (meth)acrylate; and pentaerythrit tetra (meth)acrylate.

These may be used singly or in combinations of two or more thereof.

From the viewpoint of improving the printing durability of a finally obtained printing plate and maintaining thickness uniformity, at least one (meth)acrylate is preferably used, and at least one bifunctional (meth)acrylate is more preferably used as the ethylenically unsaturated compound (b-2).

The number average molecular weight (Mn) of the ethylenically unsaturated compound (b-2) is preferably 100 or more and 1500 or less, more preferably 110 or more and 1000 or less, and further preferably 130 or more and 800 or less from the viewpoint of controlling the storage elastic modulus and/or the loss elastic modulus of the photosensitive resin composition to an appropriate numeric range.

The number average molecular weight (Mn) of the ethylenically unsaturated compound is determined by gel permeation chromatography (GPC).

The content of the ethylenically unsaturated compound (b-2) in the photosensitive resin composition layer (b) is preferably 2% by mass or more and less than 60% by mass, more preferably 5% by mass or more and 50% by mass or less, and further preferably 10% by mass or more and 40% by mass or less when the whole amount of the photosensitive resin composition layer (b) is assumed to be 100% by mass from the viewpoint of controlling the storage elastic modulus and/or the loss elastic modulus of the photosensitive resin composition to an appropriate numeric range.

[Photopolymerization Initiator (b-3)]

The photosensitive resin composition layer (b) preferably contains a photopolymerization initiator (b-3).

The photopolymerization initiator (b-3) is a compound that absorbs the energy of light to produce a radical. Examples thereof include a degradable photopolymerization initiator, a hydrogen abstraction type photopolymerization initiator, and a compound having a site functioning as a hydrogen abstraction type photopolymerization initiator and a site functioning as a degradable photopolymerization initiator in the same molecule.

Examples of the photopolymerization initiator (b-3) include, but are not limited to, benzophenones such as benzophenone, 4,4-bis(diethylamino)benzophenone, 3,3',4,4'-benzophenone tetracarboxylic anhydride, and 3,3',4,4'-tetramethoxy benzophenone; anthraquinones such as t-butyl anthraquinone and 2-ethyl anthraquinone; thioxanthones such as 2,4-diethyl thioxanthone, isopropyl thioxanthone, and 2,4-dichloro thioxanthone; Michler's ketone; acetophenones such as diethoxyacetophenone, 2,2-dimethoxy-2-phenylacetophenone, 2-hydroxy-2-methyl-1-phenylpropan-1-one, benzyl dimethyl ketal, 1-hydroxycyclohexyl-phenyl ketone, 2-methyl-2-morpholino (4-thiomethylphenyl) propan-1-one, 2-methyl-1-(4-methylthiophenyl)-2-morpholinopropan-1-one, 2-benzyl-2-dimethylamino-1-(4-morpholinophenyl)-butanone, and trichloroacetophenone; benzoin ethers such as benzoin methyl ether, benzoin ethyl ether, benzoin isopropyl ether, and benzoin isobutyl ether; acylphosphine oxides such as 2,4,6-trimethylbenzoyl diphenyl phosphine oxide, bis(2,6-dimethoxybenzoyl)-2,4,4-trimethyl pentyl phosphine oxide, and bis(2,4,6-trimethylbenzoyl)-phenyl phosphine oxide; methyl benzoylformate; 1,7-bisacridinyl heptane; 9-phenyl acridine; and azo compounds such as azobisisobutyronitrile, diazonium compounds, and tetrazene compounds.

These may be used singly or in combinations of two or more thereof.

The content of the photopolymerization initiator (b-3) in the photosensitive resin composition layer (b) is preferably 0.1% by mass or more and 10% by mass or less, more preferably 0.1% by mass or more and 5% by mass or less, and further preferably 0.3% by mass or more and 5% by mass or less when the whole amount of the photosensitive resin composition layer (b) is assumed to be 100% by mass from the viewpoint of preventing the breakage of a finally obtained printing plate and maintaining thickness uniformity during printing.

[Auxiliary Additive Component]

The auxiliary additive component is not limited, and examples thereof include a plasticizer, a thermal polymerization inhibitor, an antioxidant, a light stabilizer, an ultraviolet ray absorber, and a dye or pigment.

Examples of the plasticizer include, but are not limited to, a liquid diene such as liquid polybutadiene, liquid polyisoprene, a modified product of liquid polybutadiene, a modified product of liquid polyisoprene, a liquid acrylonitrile-butadiene copolymer, and a liquid styrene-butadiene copolymer; a hydrocarbon oil such as naphthene oil and paraffin oil; a conjugated diene rubber mainly composed of a liquid diene, such as a liquid acrylonitrile-butadiene copolymer or a liquid styrene-butadiene copolymer; a polystyrene having a number average molecular weight of 2000 or less; and an ester-based plasticizer such as a sebacic acid ester or a phthalic acid ester.

These plasticizers may have a hydroxyl group or a carboxyl group. In addition, a photopolymerizable, reactive group such as a (meth)acryloyl group may be added thereto.

The plasticizers may be used singly, or two or more thereof may be used together.

In the present specification, "liquid" means a characteristic having the property of being easily flow-deformable and capable of being solidified into a deformed shape by cooling.

The content of the plasticizer in the photosensitive resin composition layer (b) is preferably 0% by mass or more and 30% by mass or less, more preferably 8% by mass or more and 30% by mass or less, and further preferably 8% by mass or more and 25% by mass or less when the whole amount of the photosensitive resin composition layer (b) is assumed to be 100% by mass from the viewpoint of improving the flexibility of a finally obtained printing plate and improving image uniformity during printing.

As the thermal polymerization inhibitor and the antioxidant, those usually used in the field of resin materials or rubber materials can be used. Specific examples thereof include a phenol-based material.

Examples of the phenol-based material include, but are not limited to, vitamin E, tetrakis-(methylene-3-(3',5'-di-t-butyl-4'-hydroxyphenyl) propionate) methane, 2,5-di-t-butylhydroquinone, 2,6-di-t-butyl-p-cresol, 3,9-bis-{1,1-dimethyl-2-[3-(3-t-butyl-4-hydroxy-5-methylphenyl) propionyloxy] ethyl}-2,4,8,10-tetraoxaspiro(5,5) undecane, and 2-t-butyl-6-(3-t-butyl-2-hydroxy-5-methylbenzyl)-4-methylphenyl acrylate.

Other examples of the thermal polymerization inhibitor and the antioxidant include a phosphine-based material such as triphenyl phosphite.

The thermal polymerization inhibitor and the antioxidant may be used singly or in combinations of two or more thereof.

Examples of the light stabilizer and the ultraviolet ray absorber include, but are not limited to, known benzophenone-based, salicylate-based, acrylonitrile-based, metal complex-based, or hindered amine-based compounds.

The dye or pigment described below may also be used as the ultraviolet ray absorber.

Examples of such a light stabilizer and an ultraviolet ray absorber include, but are not limited to, 2-ethoxy-2'-ethyloxalic acid bisanilide, 2,2'-dihydroxy-4-methoxybenzophenone, bis(1,2,2,6,6-pentamethyl-4-piperidyl)-decanedioate, and 1, 2, 3-benzotriazole.

The dye or pigment is effective as coloring means for improving visibility.

Examples of the dye include, but are not limited to, a basic dye, an acid dye, and a direct dye, which are water-soluble, and a sulfur dye, an oil-soluble dye, and a disperse dye, which are non-water-soluble. Particularly, an anthraquinone-based dye, an indigoid-based dye, and an azo-based dye are preferable.

Examples of the pigment include, but are not particularly limited to, a natural pigment, a synthetic inorganic pigment, and a synthetic organic pigment. Examples of the synthetic organic pigment include an azo-based pigment, a triphenylmethane-based pigment, a quinoline-based pigment, an anthraquinone-based pigment, and a phthalocyanine-based pigment.

(Storage Elastic Modulus of Photosensitive Resin Composition)

In the method for producing a printing plate according to the present embodiment, a developing step of performing development by attaching or adsorbing the photosensitive resin composition of an unexposed portion to a development medium is performed after the exposure step.

The storage elastic modulus of the photosensitive resin composition of the unexposed portion at a development temperature of the developing step is 100 Pa or more and 4000 Pa or less, preferably 100 Pa or more and 350 Pa or less, more preferably 100 Pa or more and 250 Pa or less, and further preferably 130 Pa or more and 240 Pa or less.

When the storage elastic modulus of the photosensitive resin composition of the unexposed portion falls within the above numeric range, the photosensitive resin composition exhibits appropriate fluidity when contacted with the development medium, and therefore tends to be able to achieve both of favorable adsorbability to the development medium and suppression of leakage to the outside of the contact portion with the development medium. As a result, the removability of the unexposed portion is improved, and the contamination of a development apparatus can be suppressed.

In the method for producing a printing plate according to the present embodiment, the development temperature of the developing step is 0 to 200° C., and the storage elastic modulus of the photosensitive resin composition of the unexposed portion at the development temperature can be controlled to the above numeric range by adjusting the content of the polymer (b-1) in the photosensitive resin composition, the content and/or number average molecular weight (Mn) of the ethylenically unsaturated compound (b-2), or the like.

(Loss Elastic Modulus of Photosensitive Resin Composition)

In the method for producing a printing plate according to the present embodiment, a developing step of performing development by attaching or adsorbing the photosensitive resin composition of an unexposed portion to a development medium is performed after the exposure step. The loss elastic modulus of the photosensitive resin composition of the unexposed portion at a development temperature of the developing step is preferably 90 Pa or more and 500 Pa or less, more preferably 100 Pa or more and 500 Pa or less, and further preferably 130 Pa or more and 480 Pa or less.

When the loss elastic modulus is 90 Pa or more, the photosensitive resin composition is unlikely to be cut so that an unexposed photosensitive resin composition is unlikely to remain as residues on an original printing plate, when the development medium is separated from the original printing plate in the developing step. On the other hand, when the loss elastic modulus is 500 Pa or less, appropriate fluidity is obtained in the removal of an uncured resin.

In the method for producing a printing plate according to the present embodiment, the development temperature of the developing step is 0 to 200° C., and the loss elastic modulus of the photosensitive resin composition of the unexposed portion at the development temperature can be controlled to the above numeric range by adjusting the content of the polymer (b-1) in the photosensitive resin composition, the content and/or number average molecular weight (Mn) of the ethylenically unsaturated compound (b-2), or the like.

The above-described storage elastic modulus and loss elastic modulus can be measured by methods described in Examples described later.

(Suitable Form of Method for Producing Printing Plate According to Present Embodiment)

Hereinafter, suitable forms will be given as to the method for producing a printing plate according to the present embodiment.

The method for producing a printing plate according to the present embodiment is not limited by the following forms.

The method for producing a printing plate according to the present embodiment includes: the step of first performing ultraviolet ray irradiation from the support side using the above-described photosensitive resin structure for a printing plate (photosensitive resin composition laminated on the support) (first step); in the case of digital plate making, the step of drawing and processing a pattern on the infrared ray ablation layer by infrared ray irradiation, or in the case of analog plate making, the step of tightly contacting a negative with the photosensitive resin composition layer (second step); the step of irradiating the photosensitive resin composition layer with an ultraviolet ray for pattern exposure using, as a mask, the infrared ray ablation layer or the negative on which the pattern is drawn and processed (third step); and the step of removing an unexposed portion of the photosensitive resin composition layer (fourth step).

In the (fourth step), as described above, the storage elastic modulus of the photosensitive resin composition and the elastic recovery rate of the development medium are identified in the present embodiment.

If necessary, the step of performing a post-exposure treatment is then performed to obtain a printing plate formed from a cured photosensitive resin composition layer.

The method may have the step of contacting the surface of the printing plate with a liquid containing a silicone compound and/or a fluorine compound from the viewpoint of conferring peeling properties.

<First Step>

In the first step, ultraviolet ray irradiation is performed to the photosensitive resin composition layer (b) from a side of the support (a).

The ultraviolet ray irradiation method is not particularly limited, and can be carried out using a known irradiation unit. The wavelength of ultraviolet ray in the irradiation is preferably 150 nm or more 500 nm or less, and more preferably 300 or more and 400 nm or less.

The light source of the ultraviolet ray is not limited, but, for example, a low-pressure mercury lamp, a high-pressure mercury lamp, an ultrahigh-pressure mercury lamp, a metal halide lamp, a xenon lamp, a zirconium lamp, a carbon arc lamp, or a fluorescent lamp for ultraviolet ray can be used.

This first step may be performed before or after the second step described later.

<Second Step>

In the second step, the drawing and processing method in the case of drawing and processing a pattern on the infrared ray ablation layer by infrared ray irradiation is not particularly limited, and can be carried out using a known irradiation unit. The irradiation of infrared ray to the infrared ray ablation layer can be carried out from the infrared ray ablation layer side.

When the above-described photosensitive resin structure for a printing plate has a cover film, the cover film is first peeled off before the infrared ray irradiation. The infrared ray ablation layer is then pattern-irradiated with an infrared ray to decompose the resin of the irradiated part of the infrared ray, and the pattern is drawn and processed. This makes it possible to form a mask of the infrared ray ablation layer on the photosensitive resin composition layer.

Examples of the infrared laser for use in the second step include ND/YAG laser (for example, 1064 nm) or diode laser (for example, 830 nm). Laser systems suitable for CTP plate making techniques are sold on the market, and, for example, a diode laser system CDI Spark (Esko-Graphics BV.) can be used. This laser system includes: a rotary cylindrical drum that holds the photosensitive resin structure for a printing plate; infrared laser irradiation apparatus; and a layout computer, and image information is directly sent from the layout computer to the infrared laser irradiation apparatus.

In the case of performing analog plate making in the second step, a mask can be similarly formed by using a negative film.

<Third Step>

In the third step, the photosensitive resin composition layer is irradiated with an ultraviolet ray for pattern exposure using, as a mask, the infrared ray ablation layer or the negative film on which the pattern is drawn and processed.

At this time, the ultraviolet ray passing through the mask promotes a curing reaction in the photosensitive resin composition layer, and a pattern formed in the infrared ray ablation layer or the negative film is transferred to the photosensitive resin composition layer in which the convex and concave are inverted. Ultraviolet ray irradiation may be performed on the whole surface or may be performed partially.

The third step can be carried out in a state where the above-described photosensitive resin structure for a printing plate is attached to a laser cylinder of a laser system, but is generally performed by taking the photosensitive resin structure for a printing plate out of the laser system, and irradiating with an ultraviolet ray using a conventional irradiation unit. The same irradiation unit as the one illustrated in the ultraviolet ray irradiation in the first step can be used as the irradiation unit.

<Fourth Step>

The fourth step is the step of removing an unexposed portion of the photosensitive resin composition layer.

In the fourth step (developing step), the method for removing an unexposed portion involves attaching or adsorbing the unexposed portion to a development medium for removal.

The fourth step is carried out at room temperature or by heating the photosensitive resin structure for a printing plate after the third step to 40° C. or higher and 200° C. or lower. This can impart moderate fluidity to the photosensitive resin composition that is masked with the infrared ray ablation layer or the negative film and thereby is not irradiated with an ultraviolet ray, i.e., the unexposed portion.

In the case of heating the photosensitive resin composition, a conventionally known device can be used as long as the device has a function of heating the photosensitive resin composition layer. For example, any of a heating apparatus incorporated in a roll in which the photosensitive resin structure for a printing plate is placed, and a heating apparatus placed outside the roll can be used. Examples thereof include an infrared ray lamp prepared so as to irradiate the photosensitive resin composition layer with an infrared ray.

Next, the unexposed portion is attached or absorbed to the development medium and removed. In a step previous to adsorption or absorption and removal, a portion of the unexposed portion may be removed in advance with a predetermined spatula, roll, or the like.

The development medium has a predetermined absorbent layer and eliminates the unexposed portion by contacting the absorbent layer with the unexposed portion and thereby attaching or absorbing the unexposed portion thereto for removal.

If necessary, a post-exposure treatment is then performed, thereby producing a flexographic printing plate.

When an intermediate layer is located between the infrared ray ablation layer and the photosensitive resin composition layer, the intermediate layer may be removed simultaneously in the developing step.

When the photosensitive resin composition is liquid at room temperature, the first to third steps usually include a predetermined molding step of bringing the photosensitive resin composition into a state molded into a film with a constant thickness on the support inside a dedicated apparatus (plate maker).

In the case of using the liquid photosensitive resin composition as described above, the exposure step of the photosensitive resin composition is preferably carried out by, for example, each of the following steps (A1) to (A3):

Step (A1):

The step (A1) is a molding step of a photosensitive resin composition layer which involves forming a photosensitive resin composition layer by placing a negative film on an ultraviolet transmitting glass plate (lower glass plate), covering the negative film with a thin protective film, then pouring the photosensitive resin composition thereonto, laminating the resultant with a base film serving as a support via a spacer so as to attain a constant plate thickness, and further pressing an ultraviolet transmitting glass plate (upper glass plate) thereagainst.

In the case of preparing a printing plate (having a thickness of 4 mm or larger), for example, for use in cardboard printing, it is preferable for securing sufficient strength of a relief against a printing pressure at the time of printing to form a base shelf layer in a portion of the photosensitive resin composition layer on the upper glass plate side. In this case, the photosensitive resin composition layer is formed by sandwiching a dedicated negative film (masking film) between the upper glass plate and the base film before relief exposure.

Step (A2):

The step (A2) is a back exposure step of irradiating the photosensitive resin composition layer after the molding step with active ray with an active light source such as an ultraviolet fluorescent lamp (for example, ray having a wavelength distribution at 300 nm or more) via the base film from the upper glass plate side, and thereby depositing a uniform thin cured resin layer (i.e., a floor formation layer (back deposition layer)) on the whole surface on the base film side of the plate.

In the case of establishing a masking film in the photosensitive resin composition layer molding step, a shelf layer is formed by similar exposure. In this case, the step is referred to as a masking exposure step.

The back deposition layer and the shelf layer are both formed by curing the photosensitive resin composition layer on a side opposite to the relief formation layer side of the photosensitive resin composition layer, i.e., on the base film side. The photosensitive resin composition layer becomes the back deposition layer when cured on the whole surface on the base film side, and becomes the shelf layer when partially cured depending on the position of the relief formation layer.

Step (A3):

The step (A3) is a relief forming exposure step of irradiating the photosensitive resin composition layer after the back exposure step or the masking exposure step with the same active ray as in the upper glass plate side via the negative film from the lower glass side, and thereby depositing an image formation layer (relief formation layer).

In the case of forming the shelf layer by the masking exposure step, a preferable form also involves removing the masking film after the relief forming exposure step, and further performing a back exposure step to form a back deposition layer on the whole surface of the base film.

(Relief Depth)

In the method for producing a printing plate according to the present embodiment, the thickness of the relief formation layer, i.e., the relief depth, is preferably 0.1 mm or larger and 10.0 mm or smaller, more preferably 0.5 mm or larger and 3.0 mm or smaller, and further preferably 0.5 mm or larger and 2.0 mm or smaller from the viewpoint of the removability of the photosensitive resin composition of the unexposed portion. In this context, the relief depth is a length determined by subtracting the height of the back deposition layer and/or the shelf layer from a plate thickness, i.e., the depth of a printing image relief.

That is, the height of the back deposition layer is subtracted from the plate thickness when only the back deposition layer is formed, and the height of the shelf layer is subtracted therefrom when only the shelf layer is formed.

When the relief depth is 0.1 mm or larger, a relief depth necessary for printing a design can be secured. On the other hand, when the relief depth is 10.0 mm or smaller, a large contact area with the development medium with respect to the volume of the photosensitive resin composition of the unexposed portion can be secured in the developing step. Thus, the photosensitive resin composition of the unexposed portion has favorable adsorbability and removability.

The thickness of the relief formation layer (relief depth) can be controlled to the above numeric range by adjusting the dose of active ray in the above-described exposure step (A2), and adjusting the thickness of the shelf layer and/or the back deposition layer.

(Development Medium for Use in Developing Step)

In the method for producing a printing plate according to the present embodiment, the developing step involves performing development by attaching or adsorbing the photosensitive resin composition of an unexposed portion to a development medium.

The development medium preferably has an adsorbent layer as a portion or the whole thereof, and a wiper having an adsorbent layer formed from, for example, a nonwoven fabric, a sponge, a woven fabric, a knitted fabric, or paper is used as the development medium.

The wiper is preferably a nonwoven fabric, for example, from the viewpoint that wiper-derived residues are unlikely to be generated in the developing step and the removability of an unexposed photosensitive resin composition is excellent. The "nonwoven fabric" refers to a web prepared by bonding or entangling fibers through thermal, mechanical, or chemical action on the fibers.

The development medium for use in the method for producing a printing plate according to the present embodiment has an elastic recovery rate of 30% or more and 99% or less.

A pressure is applied to the development medium in the developing step. If the development medium has a low elastic recovery rate, the pressure excessively presses the development medium against the unexposed portion and thereby decreases the thickness of a finally obtained flexographic printing plate. Thus, thickness uniformity tends to be impaired. Image uniformity is thereby impaired in printing.

When the elastic recovery rate of the development medium falls within the above range, a contact area with the unexposed portion is moderately maintained. Furthermore, in the course of weakening of the pressure, the shape of the development medium is rapidly recovered, and the unexposed portion is easily adsorbed thereto because of an elevated porosity and can be removed at a smaller pressure.

For obtaining these effects, the elastic recovery rate of the development medium is 30% or more and 99% or less, preferably 35% or more and 99% or less, more preferably 40% or more and 99% or less, and further preferably 60% or more and 99% or less. Excellent adsorbability and removability are exerted by defining the elastic recovery rate as 69% or more.

The combination thereof with the photosensitive resin composition having the above-described storage elastic modulus further improves the removability of the photosensitive resin composition of the unexposed portion and is capable of more improving the thickness uniformity of a finally obtained printing plate.

The elastic recovery rate of the development medium can be measured by a method described in Examples described later.

The elastic recovery rate of the development medium can be controlled to the above numeric range by adjusting a temperature upon entry to a press roll for carrying out the heat adhesion of constituent materials in a production process of the development medium. Examples of a method for adjusting the temperature include, but are not particularly limited to, a method of effectively exploiting the heat loss of a heating press roll using a heat retaining plate, and a method of preheating a nonwoven fabric serving as the development medium with a preheating roll.

For example, a thermoplastic resin can be used as a material of the development medium.

Examples of the thermoplastic resin include a polyester-based resin and/or a polyester-based copolymer, and a polyamide-based resin.

Since the unexposed portion of the photosensitive resin composition layer may be wiped off while warmed, it is preferable that the development medium has heat resistance. The development medium satisfies this heat resistance as long as the development medium contains the above-described resin. It is more preferable that the development medium for heat development contains a polyester-based resin and/or a polyester copolymer from the viewpoint of improving the removability of the photosensitive resin composition ascribable to affinity for the photosensitive resin composition.

Examples of the polyester-based resin include, but are not limited to, polyethylene terephthalate, polytrimethylene terephthalate, polybutylene terephthalate, polyethylene terephthalate, and polybutylene naphthalate.

Examples of the polyester-based copolymer include a resin obtained by copolymerizing the above-described polyester-based resin with another polymer, and a resin modified by partially introducing a functional group.

Examples of the polyamide-based resin include, but are not limited to, nylon 6 and nylon 6,6.

The wiper as the development medium is preferably a nonwoven fabric having a laminate structure that contains at least two fiber layers (II layers) having a fiber diameter of 5.0 μm or larger and 30.0 μm or smaller, and contains the extra-thin fiber layer (I layer) having a fiber diameter of 0.1 μm or larger and 5.0 μm or smaller as an intermediate layer between the fiber layers (II layers) having a fiber diameter of 5.0 μm or larger and 30.0 μm or smaller.

In the nonwoven fabric having the laminate structure, the fiber layers having a thick fiber diameter (hereinafter, also referred to as thick fiber layers) are disposed as surface layers, and wipeability is improved by a scraping effect brought about by the contact, with the photosensitive resin composition, of the convexo-concave shape of thick fibers present on the surfaces of the nonwoven fabric. A wiped-off photosensitive resin composition passes through the highly porous thick-fiber layers and can be retained in the extra-thin fiber layer. Thus, a larger number of long-term repetitive uses can be achieved. When the development medium contains the extra-thin fiber layer, a dense network structure can be formed, drastically improving the ability to support a resin. Since this supporting ability also contributes to the suppression of bleed-through of a wiped-off photosensitive resin composition, a flexographic printing plate can be stably produced.

The elastic recovery rate of the whole wiper having the laminate structure depends on the elastic recovery rate of outermost surface layers which easily cause elastic change. In the case of, for example, the nonwoven fabric having the laminate structure, the elastic recovery rate of the whole nonwoven fabric having the laminate structure is equivalent to the elastic recovery rate of the outermost thick fiber layers (II layers).

When the development medium is a nonwoven fabric, the nonwoven fabric may undergo thermal pressure bonding. In this case, the thermal pressure bonding rate (the area of a pressure-bonded portion relative to the area of the nonwoven fabric) is preferably 5% or more and 20% or less, and more preferably 11% or more and 17% or less.

A method for producing the nonwoven fabric is not particularly limited, and a known method can be used. A production method for the thick fiber layers (II layers) is preferably a spun-bond method, a dry method, a wet method, or the like. Examples of the fibers for use in the thick fiber layers (II layers) include thermoplastic resin fibers. For example, a production method, such as a dry method or a wet method, using extra-thin fibers, an electrospinning method, a melt-blown method, or a force spinning method can be used as a production method for the extra-thin fiber layer (I layer) constituted by extra-thin fibers having a fiber diameter of 0.1 μm or larger and 5.0 μm. The extra-thin fiber layer (I layer) is particularly preferably formed by a melt-blown method from the viewpoint that the extra-thin fiber layer (I) can be formed easily and densely. Alternatively, the fibers may be used for the production of a nonwoven fabric after achievement of split yarn or fibril formation by a beating process, partial dissolution, or the like.

Examples of a method for forming the nonwoven fabric having the laminate structure having the above-described extra-thin fiber layers (I layers) and thick fiber layer (II layer) include a method based on integration by thermal bonding, a method of causing three-dimensional entanglement by jetting a fast water stream, and a method of causing integration using a particulate or fibrous adhesive.

Examples of the integration method by thermal bonding include integration by a thermal embossing (thermal emboss roll scheme) and integration by high-temperature hot air (air-through system).

The integration by thermal bonding is preferable from the viewpoint that a laminated nonwoven fabric can be formed without the use of a binder.

The integration by thermal bonding can be performed, for example, by joining using a press roll (flat roll or emboss roll) at a temperature lower by 50 to 120° C. than the melting point of a synthetic resin at a linear pressure of 100 to 1000 N/cm.

When the linear pressure in the heat adhesion step is 100 N/cm or higher, sufficient adhesive effect is obtained and sufficient strength can be exerted. When the linear pressure is 1000 N/cm or lower, the fibers can be prevented from being largely deformed and increase in apparent density or decrease in porosity can be prevented. Thus, the advantageous effects of the present invention are effectively obtained.

The integration by thermal bonding is capable of controlling a nonwoven fabric temperature upon entry to the press roll in the heat adhesion step and thereby controlling subsequent compression characteristics of the nonwoven fabric. The nonwoven fabric temperature upon entry to the press roll corresponds to a temperature at a position of 50 cm upstream from a roll nip point. For example, in the case of using polyester, the elastic recovery rate and compression rate of the nonwoven fabric as described above can be obtained, specifically, by setting the nonwoven fabric temperature upon entry to the press roll to the range of 40 to 120° C. The nonwoven fabric temperature preset to a high temperature as described above promotes thread crystallinity in advance, thereby suppressing excessive pressure bonding at a junction while securing a minimum necessary amount of amorphous matter for thread-thread adhesion. Thus, a nonwoven fabric having a high elastic recovery rate can be obtained.

Examples of a method for adjusting the nonwoven fabric temperature to the above range include, but are not particularly limited to, a method of effectively exploiting the heat loss of a heating press roll using a predetermined heat retaining plate, and a method of preheating the nonwoven fabric with a preheating roll.

The most preferable method for forming the nonwoven fabric as the development medium is a method of sequentially producing a spun-bond nonwoven fabric layer and a melt-blown nonwoven fabric layer, and optionally a spun-bond nonwoven fabric layer, and laminating these layers, followed by pressure bonding using an emboss roll or a heat press roll.

This method is preferable for the purpose of obtaining a uniform nonwoven fabric with a low weight basis because a laminated nonwoven fabric can be formed from the same material and because production can be performed in a continuous and integrated production line.

Specifically, one or more spun-bond nonwoven fabric layers are spun on a conveyor using a thermoplastic resin and sprayed with one or more nonwoven fabric layers made of extra-thin fibers having a fiber diameter of 0.1 to 5 μm by a melt-blown method using a thermoplastic resin. Then, one or more spun-bond nonwoven fabric layers constituted by thermoplastic resin fibers using a thermoplastic resin are laminated thereto. Next, these layers are pressure-bonded and integrated by calendering using a metal roll. This method is a preferable method. The calendering includes a method of pressure-bonding nonwoven fabric layers using a heat roll. This method can be carried out in a continuous and integrated production line and is therefore suitable for obtaining a uniform nonwoven fabric with a low weight basis.

The heat adhesion step can be performed, for example, at a temperature lower by 50° C. to 120° C. than the melting point of a thermoplastic resin as a reference at a linear pressure of 100 to 1000 N/cm. The linear pressure that falls within the above range in calendering is preferable from the viewpoint of improvement in the strength or porosity of a nonwoven fabric. The heat roll for use in calendering may be a roll having surface asperities such as an embossed or matte finish pattern, or may be a smooth flat roll. The surface pattern of the roll having surface asperities is an embossed pattern, a matte finish pattern, a rectangular pattern, a linear patter, or the like and is not limited as long as fibers can be thermally bonded.

(Recovery and Recycle of Photosensitive Resin Composition of Unexposed Portion)

The method for producing a printing plate according to the present embodiment can contain the step of recovering the photosensitive resin composition of the unexposed portion attached or adsorbed to the development medium in the above-described developing step as a photosensitive resin composition for the production of a new printing plate. This recovered photosensitive resin composition can be recycled as a photosensitive resin composition for the production of a new printing plate.

The recovered photosensitive resin composition may be added to an exposure machine in the production of a new printing plate. In the case of processing and molding the photosensitive resin composition before exposure, the photosensitive resin composition recovered in the processing and molding step may be used.

The exposure machine to which the recovered photosensitive resin composition is added refers to an exposure machine having a unit of laminating a support and a photosensitive resin into layers, and the recovered photosensitive resin composition can be used when the unit is charged with the photosensitive resin composition.

Use of the recovered photosensitive resin composition permits waste reduction as well as reduction in material cost.

The method for producing a printing plate according to the present embodiment has the following effects (1) to (5).

(1) The removability of an unexposed photosensitive resin composition in the developing step is improved.

(2) Since the balance between the elastic recovery rate of the development medium and the storage elastic modulus of the photosensitive resin composition is excellent, the unexposed photosensitive resin composition has moderate fluidity. In addition, a large amount of the unexposed photosensitive resin composition can be retained in a pore portion of the development medium, and high recovery efficiency can be achieved.

(3) Since the development medium has an appropriate elastic recovery rate, the unexposed photosensitive resin composition can be easily separated by applying a pressure to the development medium and the recovery rate of the photosensitive resin composition can be improved.

(4) In the developing step, the unexposed photosensitive resin composition can be removed and recovered without excessive pressurization, heating, or the like. This can prevent the degradation of the photosensitive resin composition and can reduce contamination by impurities derived from the development medium. The photosensitive resin composition of high quality can therefore be recycled.

(5) The amount of deteriorated photosensitive resin composition residues that remain in the development medium is small, or the development medium itself is less deteriorated in the developing step. Thus, the exchange frequency of the development medium can be decreased.

[Printing Method]

The printing method of the present embodiment contains: the step of producing a printing plate by the above-described method for producing a printing plate according to the present embodiment; and a printing step of performing printing using the produced printing plate.

In a particularly preferable form, a flexographic printing plate is produced by the method for producing a printing plate according to the present embodiment, and flexographic printing is carried out.

EXAMPLES

Hereinafter, the present invention will be described more specifically with reference to specific Examples and Comparative Examples, but the present invention is not limited to the following examples by any means.

[Physical Properties and Characteristics of Photosensitive Resin Composition]

Hereinafter, the physical properties and characteristics of a photosensitive resin composition used in each of Examples and Comparative Examples described later will be described.

<Storage Elastic Modulus and Loss Elastic Modulus>

In the case of using a photosensitive resin composition having no fluidity at 25° C., the photosensitive resin composition was kneaded using a pressure kneader of 120° C. for preliminary processing, then added to an extruder, extruded at a thickness of 3 mm from a T-die, and a 25 mm round shape was then punched in the obtained extrudate to prepare a sample for measurement. Its storage elastic modulus and loss elastic modulus were measured under measurement conditions given below.

In the case of using a photosensitive resin composition having fluidity at 25° C., the photosensitive resin composition was directly loaded in a rheometer described below without preliminary processing, and its storage elastic modulus and loss elastic modulus were measured under measurement conditions given below.

In order to measure the storage elastic modulus and the loss elastic modulus in a development temperature range used in Examples described later, the measurement was carried out at the following measurement temperature.

[Measurement Conditions]

Device: "AR550" manufactured by TA Instruments, Inc.

Geometry: 25 mm

Normal stress: 0 N control

Measurement temperature: 25 to 200° C. (temperature change rate: 3° C./min)

Applied strain: 0.1%

Frequency: 1 Hz

<Relief Depth>

The thickness of a relief formation layer (relief depth) was measured as described below.

The thickness of the whole printing plate, the thickness of a support, and the thickness of a shelf layer or a back deposition layer were measured using ABS Digimatic Indicator ID-C112 (manufactured by Mitsutoyo Corporation), and the relief depth was calculated according to an expression given below.

The relief formation layer is a layer formed in (A3) of <Molding and Exposure Step> described later.

The shelf layer is a layer formed in (A2) of <Molding and Exposure Step> described later.

The back deposition layer is a layer formed in (A2) of <Molding and Exposure Step> described later. The back deposition layer is formed when the photosensitive resin composition is cured on the whole support, and the shelf layer is formed when the photosensitive resin composition partially remains uncured.

$$\text{Relief depth (mm)} = \text{Thickness (mm) of the whole printing plate} - (\text{Thickness of the back deposition layer or the shelf layer} + \text{Thickness of the support}) \text{ (mm)}$$

[Physical Properties and Characteristics of Wiper (Nonwoven Fabric) as Development Medium]

Hereinafter, the physical properties and characteristics of a wiper nonwoven fabric as a development medium used in each of Examples and Comparative Examples described later will be described.

<Elastic Recovery Rate>

The elastic recovery rate of the wiper nonwoven fabric as a development medium used in a developing step was measured as described below.

The elastic recovery rate of the nonwoven fabric was measured using MCT-50 Micro Compression Tester manufactured by Shimadzu Corporation Testing conditions were set to a loading-unloading mode which involved applying a load up to a maximum test force to the sample for measurement, and then performing unloading up to a minimum test force for measurement.

The minimum test force was 0.05 mN, and the maximum test force was set to a test force when nonwoven fabric thickness d was deformed by 10% in a compression mode.

The elastic recovery rate was calculated as follows.

$$\text{Elastic recovery rate (\%)} = L2/(L1-L2) \times 100$$

L1: difference in displacement between the maximum test force and the minimum test force in the loading mode.

L2: difference in displacement between the maximum test force and the minimum test force in the unloading mode.

[Production of Wiper]

A wiper serving as a development medium used in a developing step was prepared as described below.

The wiper was formed from a nonwoven fabric.

<Production Example of Nonwoven Fabric 1>

Polyethylene terephthalate (PET) was discharged at a spinning temperature of 290° C. from a spinneret for the spun-bond (V-shaped nozzle), and yarns were symmetrically cooled from both lateral sides (wind speed: 0.5 m/s for both) with a cooling apparatus immediately below the spinneret, followed by traction in draw jet to obtain continuous long fibers (II layer, fiber diameter: 16 μm). The fibers were opened and dispersed, and deposited on a web conveyor to form a web.

Subsequently, an extra-thin fiber layer (I layer, fiber diameter: 3 μm) was spun by the melt-blown method using a PET solution under conditions involving a spinning temperature of 290° C., and the above-described web was sprayed therewith. In this respect, a distance from a melt-blown nozzle to the web was 300 mm. A suction power on a capture surface immediately below the melt-blown nozzle was set to 0.2 kPa, and a wind speed was set to 7 m/sec.

A web of continuous long fibers (II layer, fiber diameter: 16 μm) prepared by the same spun-bond method as above was laminated onto the extra-thin fiber layer (I layer) to obtain a laminated web.

The laminated web was integrated with a calender roll (roll temperature: 220° C., linear pressure: 500 N/cm) to prepare a nonwoven fabric 1. The position of a heat retaining plate of a heating roll was adjusted such that a cloth temperature before press, which is important for the control of compression characteristics, was the temperature described in [Table 1] below.

In Table 1 below, "Flat" as a calender roll type represents a calender roll for flat processing, and this calender roll applies pressure bonding over the whole surface. "Emboss" represents a calender roll for embossing, and this calender roll is a roll having asperities and applies pressure bonding on a portion of the nonwoven fabric surface.

In Table 1 below, the thermal pressure bonding rate is the ratio of the area of a pressure-bonded portion to the area of the nonwoven fabric, and its unit is %.

The other production conditions and the physical properties and evaluation results of the prepared nonwoven fabric are shown in [Table 1] below.

<Production Examples of Nonwoven Fabrics 2, 3, and 4>

The resin shown in [Table 1] below was discharged at a spinning temperature of 290° C. from a spinneret for spun-bond (V-shaped nozzle), and yarns were symmetrically cooled from both lateral sides (wind speed: 0.5 m/s for both) with a cooling apparatus immediately below the spinneret, followed by traction in draw jet to obtain continuous long fibers (fiber diameter: 16 μm). The fibers were opened and dispersed, and deposited on a web conveyor to form a web.

In [Table 1] below, "PET/CoPET" represents fibers with a sheath-core structure of polyester and a polyester copolymer.

The web was integrated with a calender roll (roll temperature: 220° C., linear pressure: 500 N/cm) to prepare a nonwoven fabric 2. The position of a heat retaining plate of a heating roll was adjusted such that a cloth temperature before press, which is important for the control of a compressive recovery rate, was the temperature described in [Table 1] below.

A nonwoven fabric 3 was prepared in the same manner as in the nonwoven fabric 2 except that the cloth temperature before calendering was 71° C.; and the calender roll temperature was 220° C.

A nonwoven fabric 4 was prepared in the same manner as in the nonwoven fabric 2 except that the resin used was "PET/CoPET"; and flat was used as a calender roll type.

The other production conditions and the physical properties and evaluation results of the prepared nonwoven fabrics are shown in [Table 1] below.

<Production Examples of Nonwoven Fabrics 5, 6, and 7>

Nonwoven fabrics 5 to 7 were prepared in the same manner as in the nonwoven fabric 2 except that the material resin was nylon (nonwoven fabric 5) or polyethylene terephthalate (nonwoven fabrics 6 and 7); the cloth temperature before calendering was 24 to 25° C. which was an ambient temperature; and the calender roll temperature was 180° C. for the nonwoven fabric 7.

The production conditions used and the physical properties and evaluation results of the prepared nonwoven fabrics are shown in [Table 1] below.

In Table 1 below, "Ny" represents nylon (polyamide), and "PET" represents fibers with a sheath-core structure of polyethylene terephthalate.

In Table 1, "Thermal pressure bonding rate (%)" is the area of a pressure-bonded portion relative to the area of the nonwoven fabric.

TABLE 1

| | | Fiber length mm | Fiber diameter μm | Calendering condition | | | | |
| | Resin material | | | Calender roll type | Thermal pressure bonding rate (%) | Cloth temperature ° C. | Roll temperature ° C. | Elastic recovery rate % |
|---|---|---|---|---|---|---|---|---|
| Nonwoven fabric 1 for heat development | PET | >200 | 16/3/16 | Emboss | 13 | 71 | 220 | 86.5 |
| Nonwoven fabric 2 for heat development | PET | >200 | 16 | Emboss | 10 | 74 | 200 | 96.8 |
| Nonwoven fabric 3 for heat development | PET | >200 | 16 | Emboss | 13 | 71 | 220 | 86.2 |
| Nonwoven fabric 4 for heat development | PET/CoPET | >200 | 16 | Flat | — | 72 | 220 | 69.2 |

TABLE 1-continued

| | | Fiber length mm | Fiber diameter μm | Calender roll type | Calendering condition | | | |
| | Resin material | | | | Thermal pressure bonding rate (%) | Cloth temperature ° C. | Roll temperature ° C. | Elastic recovery rate % |
| --- | --- | --- | --- | --- | --- | --- | --- | --- |
| Nonwoven fabric 5 for heat development | Ny | >200 | 16 | Emboss | 13 | 24 | 200 | 38.9 |
| Nonwoven fabric 6 for heat development | PET | >200 | 16 | Emboss | 13 | 25 | 200 | 31.7 |
| Nonwoven fabric 7 for heat development | PET | >200 | 16 | Emboss | 13 | 25 | 180 | 28.6 |

[Production of Flexographic Printing Plate]

In Examples and Comparative Examples given below, a flexographic printing plate was produced using a heat development system.

An unsaturated prepolymer composition used in a photosensitive resin composition was produced in (Production Example 1) and (Production Example 2) below.

(Production Example 1) Production of Unsaturated Prepolymer Composition A 1200 g of 1,2-polybutadiene glycol hydride ("GI-3000" manufactured by Nippon Soda Co., Ltd.; hereinafter, referred to as "GI-3000") as a diol and 0.46 g of dibutyltin dilaurate were added and stirred at 40° C. until homogeneous to obtain a mixture.

To the obtained mixture, 100 g of tolylene diisocyanate ("CORONATE T80" manufactured by Nippon Polyurethane Industry Co., Ltd.; hereinafter, abbreviated to "TDI") was added thereto and further stirred.

After becoming homogeneous, the mixture was heated to 80° C. and then reacted for 4 to 5 hours to prepare a prepolymer precursor having isocyanate groups at both ends.

To the obtained prepolymer precursor, 600 g of poly(oxypropylene)glycol monomethacrylate ("Blemmer PP" manufactured by NOF Corporation; hereinafter, abbreviated to "PPM") was added as a (meth)acrylating agent and reacted for 2 hours to obtain a reaction product.

A portion of the obtained reaction product was isolated and subjected to IR spectrometry to confirm the disappearance of the isocyanate groups. In this way, an unsaturated prepolymer composition A was obtained.

(Production Example 2) Production of Unsaturated Prepolymer Composition B 1200 g of poly(3-methyl-1,5-pentanediol adipate)diol ("Kurapol P3010" manufactured by Kuraray Co., Ltd.; hereinafter, abbreviated to "P3010") and 800 g of polyoxyethylene (EO)-oxypropylene (PO) block copolymer diol ("SUNNIX PL2100" manufactured by Sanyo Chemical Industries, Ltd.; hereinafter, abbreviated to "PL2100") as diols, 137 g of TDI as isocyanate, 387 g of PPM as a (meth)acrylating agent, and 0.03 g of dibutyltin dilaurate were used. The other conditions were the same as in (Production Example 1) to obtain an unsaturated prepolymer composition B.

Examples 1 to 4 and 9 to 16 and Comparative Examples 1 and 3

To the unsaturated prepolymer composition A of (Production Example 1) described above, the ethylenically unsaturated compound, the photopolymerization initiator, the antioxidant, and the like shown in [Table 2] and [Table 3] below were added, and the mixture was stirred and mixed in a warmed state of 60° C. to obtain photosensitive resin compositions shown in [Table 3] below.

Flexographic printing plates were prepared through a molding and exposure step, a developing step, a post-exposure step, and a drying step sequentially using the obtained photosensitive resin compositions 1 to 4 and 9.
<Molding and Exposure Step>

Each photosensitive resin composition was subjected to molding and exposure by (A1) to (A3) using "ALF-213E plate maker" manufactured by Asahi Kasei Corporation.
(A1):

A photosensitive resin composition layer was formed by placing a negative film on an ultraviolet transmitting glass plate (lower glass plate), covering the negative film with a thin protective film, then pouring the photosensitive resin composition thereonto, laminating the resultant with a base film serving as a support via a spacer so as to attain a constant plate thickness, and further pressing an ultraviolet transmitting glass plate (upper glass plate) thereagainst. In order to compensate for the strength of a relief against a printing pressure at the time of printing, a base shelf layer was formed in a portion of the photosensitive resin composition layer on the upper glass plate side. The photosensitive resin composition layer was formed by sandwiching a dedicated negative film (masking film) between the upper glass plate and the base film before relief exposure.
(A2):

The photosensitive resin composition layer thus formed was irradiated with active ray with an active light source such as an ultraviolet fluorescent lamp (ray having a wavelength distribution at 300 nm or more) via the base film from the upper glass plate side.

A shelf layer was formed by masking exposure because the masking film was established in the photosensitive resin composition layer formation step.
(A3):

A relief formation layer was obtained by a relief forming exposure step of irradiating the photosensitive resin composition layer after the masking exposure step with the same active ray as in the upper glass plate side via the negative film from the lower glass side, and thereby performing image formation.

A photosensitive resin composition layer having a negative film (masking film) for a shelf layer was formed as described in the above step (A1).

Here, the negative film (masking film) used was capable of forming a 300 mm×500 mm shelf layer. The negative film for relief formation used was provided with a design for forming a 500 μm wide linear non-exposed portion (hereinafter, referred to as "open" or an "open line") within a 200 mm×250 mm solid image.

Subsequently, the photosensitive resin composition layer was exposed as described in the above steps (A2) and (A3) to obtain an original flexographic printing plate having a plate thickness of 3 mm and the relief depth described in [Table 4] below.

The dose of masking exposure was appropriately adjusted in order to adjust the relief depth.

The relief forming exposure step was performed at a dose set to 300 mJ/cm$^2$.

<Developing Step>

An unexposed photosensitive resin composition was recovered and removed using a rubber spatula, and the original flexographic printing plate thus exposed was then fixed to a motor-driven metal roll having a diameter of 35 cm using a double-sided adhesive tape.

The nonwoven fabric shown in [Table 1], [Table 4], and [Table 5] below was placed so as to be capable of passing between a plurality of heatable metal rolls having a diameter of 5 cm.

The metal roll was rotated at 2 rpm by a motor.

On the metal roll, the nonwoven fabric was contacted at a contact pressure of 1.0×10$^5$ Pa with the photosensitive resin composition layer surface of the original flexographic printing plate, and allowed to pass therethrough.

An unexposed portion of the photosensitive resin composition layer was removed by contacting the original flexographic printing plate with the nonwoven fabric until the unexposed photosensitive resin composition was no longer attached to the nonwoven fabric.

The developing step was performed in an environment of 25° C.

<Post Exposure Step>

Post exposure was performed by an in-water exposure scheme using "AL-200UP post exposure machine" manufactured by Asahi Kasei Corporation which has both an ultraviolet fluorescent lamp and a germicidal lamp.

The post exposure was performed for an exposure time such that the dose of irradiation from each light source was 2000 mJ/cm$^2$ (ultraviolet fluorescent lamp) and 2000 mJ/cm$^2$ (germicidal lamp) on the plate surface.

<Drying Step>

The plate thus post-exposed was dried for about 30 minutes using "ALF-DRYER" manufactured by Asahi Kasei Corporation until water disappeared from the surface to obtain a flexographic printing plate.

Examples 17 and 18

Flexographic printing plates were obtained in the same manner as in the production step of Example 1 described above except that the plate thickness was set to 12 mm; and in the relief forming exposure step, the dose was set to 600 mJ/cm$^2$.

Examples 5 to 7

Flexographic printing plates were obtained in the same manner as in the production step of Example 1 described above except that the unsaturated prepolymer composition was the unsaturated prepolymer composition B of Production Example 2; the photosensitive resin compositions 5 to 7 were used; and in the relief forming exposure step, the dose was set to 600 mJ/cm$^2$.

Example 8 and Comparative Example 2

(Production of Laminate of Support and Photosensitive Resin Composition Layer)

<Production Examples of Photosensitive Resin Compositions 8 and 10>

The starting materials described in [Table 3] below were kneaded using a pressure kneader of 160° C. to obtain photosensitive resin compositions 8 and 10.

<Production of Laminate of Photosensitive Resin Composition Layer and Support using Photosensitive Resin Compositions 8 and 10>

Next, the photosensitive resin composition was added to an extruder. Then, to one side of the photosensitive resin composition layer extruded from a T-die was laminated a support (polyethylene terephthalate film), and to the side opposite to the support-laminated side of the photosensitive resin composition layer was laminated a release film (manufactured by Mitsubishi Chemical Corporation, DIAFOIL MRV100), to thereby obtain a laminate of the support and the photosensitive resin composition layer.

(Production of Infrared Ray Ablation Layer Laminate)

7.8 parts by mass of TUFPRENE 315 (manufactured by Asahi Kasei Corporation, styrene-butadiene block copolymer), 70.4 parts by mass of toluene, and 17.6 parts by mass of propylene glycol 1-monomethyl ether 2-acetate (PMA) were mixed to dissolve TUFPRENE 315 in the solvent.

Thereafter, carbon black (manufactured by Mitsubishi Chemical Corporation, #30) were further charged, then the mixture was mixed for 4 hours using a bead mill to obtain a carbon black dispersion.

A 100 μm thick PET film serving as a cover film was coated with the carbon black dispersion obtained above so that the film thickness after drying was 2.5 μm. A drying treatment at 90° C. for 2 minutes was performed to obtain an infrared ray ablation layer laminate which was a laminate of the infrared ray ablation layer and the cover film.

(Production of Flexographic Printing Plates of Example 8 and Comparative Example 2)

The release film was peeled from the 300 mm×500 mm laminate of the support and the photosensitive resin composition layer, and the infrared ray ablation layer laminate was laminated in an environment with a temperature of 25° C. and a humidity of 40% so that the infrared ray ablation layer was in contact with the photosensitive resin composition layer. The laminate was disposed on a hot plate set to 120° C. so that the cover film side was in contact with the heating portion of the hot plate, then heat was added thereto for 1 minute to obtain a photosensitive resin structure 1 for a flexographic printing plate.

The cover film was peeled off from the photosensitive resin structure 1 for a flexographic printing plate prepared as described above. The resulting structure was placed in Esko CDI SPARK2530 and subjected to drawing at laser intensity of 3.8 J so as to give a design in which a 500 μm wide open line was formed within a 200 mm×250 mm solid image.

The whole surface was first exposed at 530 mJ/cm$^2$ from the support side using a lower ultraviolet lamp (UV Lamp TL80W/10R manufactured by Koninklijke Philips N. V., trade name) on "AFP-1216E" exposure machine (manufactured by Asahi Kasei Corporation, trade name) such that the relief depth of the finally obtained flexographic printing plate was 2.0 mm to form a back deposition layer.

Subsequently, pattern exposure was performed by irradiation with an ultraviolet ray of 8000 mJ/cm$^2$ from the cover film side using an upper lamp (UV Lamp TL80W/10R manufactured by Koninklijke Philips N.V., trade name) to obtain an original flexographic printing plate. At this time, exposure intensity was measured with a UV illuminometer MO-2 type machine manufactured by ORC MANUFACTURING CO., LTD. (manufactured by ORC MANUFACTURING CO., LTD., trade name, UV-35 filter).

The original flexographic printing plate thus exposed was fixed to a motor-driven metal roll having a diameter of 35 cm using a double-sided adhesive tape.

The nonwoven fabric shown in Tables 1, 4, and 5 was placed so as to be capable of passing between a plurality of heatable metal rolls having a diameter of 5 cm.

An infrared lamp for relatively rapidly heating the photosensitive resin composition layer was fixed onto the metal roll on which the original flexographic printing plate was held.

The infrared lamp was turned on, and the metal rolls in a state heated to 170° C. were slowly (2 rpm) rotated by a motor. On the metal roll, the nonwoven fabric was contacted at a contact pressure of $1.0 \times 10^5$ Pa with the photosensitive resin composition layer surface of the original flexographic printing plate, and allowed to pass therethrough.

An unexposed portion of the photosensitive resin composition layer was removed by contacting the original flexographic printing plate with the nonwoven fabric until the unexposed photosensitive resin composition was no longer attached to the nonwoven fabric.

[Evaluation of Flexographic Printing Plate]

<Evaluation of Open Depth (Residue)>

The groove shape of the 500 μm wide open line was observed using uDEPTH & HEIGHT MEASURING SCOPE KY-90 (manufactured by Nisshooptical Co., Ltd.), and the depth of the groove was measured.

Evaluation criteria for the measurement results are shown below.

In the following evaluation criteria, a sample given a score of A to D was evaluated as being practically usable without any problem.

(Evaluation Criteria)

A: A depth of 151 μm or larger

B: A depth of 121 to less than 151 μm

C: A depth of 91 to less than 121 μm

D: A depth of 70 to less than 91 μm

E: A depth of less than 70 μm

<Evaluation of Thickness Uniformity Based on Thickness Accuracy>

The plate thickness of the solid image portion of the flexographic printing plate was measured at arbitrary nine points using ABS Digimatic Indicator ID-C112 (manufactured by Mitsutoyo Corporation), and the difference between the maximum value and the minimum value was calculated as thickness accurate, thereby evaluating thickness uniformity.

In the following evaluation criteria, a sample given a score of A to D was evaluated as being practically usable without any problem.

(Evaluation Criteria)

A: Thickness accuracy of less than 0.05 mm

B: Thickness accuracy of 0.05 mm or more and less than 0.07 mm

C: Thickness accuracy of 0.07 mm or more and less than 0.10 mm

D: Thickness accuracy of 0.10 mm or more and less than 0.15 mm

E: Thickness accuracy of 0.15 mm or more

<Evaluation of Recovery Rate of Photosensitive Resin Composition>

When a mass determined by subtracting the mass of the flexographic printing plate produced by development using a developing solution from the sum of the mass of the photosensitive resin composition and the mass of the support used in the production of the flexographic printing plate was assumed to be 100, the recovery rate of the photosensitive resin composition was calculated according to the following expression on the basis of the mass ratio of an unexposed photosensitive resin composition isolated from the nonwoven fabric used in the above-described production method.

Photosensitive resin composition recovery rate (%)= (Mass of the unexposed photosensitive resin composition isolated from the nonwoven fabric after development)/{(Mass of the photosensitive resin composition used in the production of the flexographic printing plate)+(Mass of the support)−(Mass of the flexographic printing plate produced by development in a developing solution)}×100

In the following evaluation criteria, a sample given a score of ○ and ◎ was evaluated as being practically usable without any problem.

(Evaluation Criteria)

◎: A photosensitive resin composition recovery rate of 80% or more

○: A photosensitive resin composition recovery rate of 40% or more and less than 80%

X: A photosensitive resin composition recovery rate of less than 40%

Examples 5, 5-2, and 5-3 and Comparative Examples 4 and 5

Flexographic printing plates of Examples 5-2 and 5-3 and Comparative Examples 4 and 5 were prepared by the same method as in Example 5 except that the development method and the photosensitive resin composition were each changed as shown in Table 6 below.

In Examples 5, 5-2, and 5-3 and Comparative Examples 4 and 5, the following methods 1 to 4 were adopted as development methods for the recovery rate evaluation of the photosensitive resin composition.

(Development Method)

1: The method described in Example 1 is carried out.

2: Development is carried out by mere contact with the nonwoven fabric without the use of a rubber spatula in the removal of the unexposed photosensitive resin composition.

3: Development is caried out using a rubber spatula alone in the removal of the unexposed photosensitive resin composition.

4: Development is carried out using a developing solution.

The development with the developing solution used in the above-described evaluation was performed under conditions involving a liquid temperature of 40° C. and a development time of 15 minutes by using "AL-400W developing machine" manufactured by Asahi Kasei Corporation (a drum rotary spray system, the number of drum rotations: 20 rpm/minute, spray pressure: 0.15 Pa) and preparing, as the developing solution, an aqueous solution containing 2% by mass of "APR (R) washing agent type W-13" manufactured by Asahi Kasei Corporation which is capable of emulsifying the photosensitive resin composition, 0.6% by mass of "APR (R) surface treatment agent type A-10" manufactured by Asahi Kasei Corporation, and 0.3% by mass of "anti-foaming agent SH-4" (silicone mixture) manufactured by Asahi Kasei Corporation.

The plate thus developed was washed to the extent that foam from the developing solution was rinsed off with tap water.

The above-described development methods and the photosensitive resin composition recovery rates obtained according to the above-described expression were summarized in Table 6.

In Table 6, "photosensitive resin composition No. 5'" represents an unexposed photosensitive resin composition removed with a rubber spatula and the nonwoven fabric and then recovered (recovered photosensitive resin composition).

In Table 6, (Example 5-2) is an example in which in the production step of the flexographic printing plate of Example 5, the development method was changed to the above development method 2. (Example 5-3) is an example in which in the production step of the flexographic printing plate of Example 5, the recovered photosensitive resin composition was used as the photosensitive resin composition. (Comparative Example 4) is an example in which in the production step of the flexographic printing plate of Example 5, the development method was changed to the above development method 3. (Comparative Example 5) is an example in which in the production step of the flexographic printing plate of Example 5, the development method was changed to the above development method 4.

TABLE 2

| Abbreviation | Compound name | Trade name | Manufacturer or distributor |
| --- | --- | --- | --- |
| D1101 | Styrene-butadiene-styrene block copolymer | Kraton D1101 | Kraton Polymers Japan Ltd. |
| TUFPRENE A | Styrene-butadiene-styrene block copolymer | TUFPRENE A | Asahi Kasei Corporation |
| TMPT | Trimethylolpropane trimethacrylate | NK Ester TMPT | Shin-Nakamura Chemical Co, Ltd. |
| M120 | Diethylene glycol (2-ethylhexyl) ether acrylate | ARONIX M-120 | TOAGOSEI Co., Ltd. |
| NDA | 1,9-Nonanediol diacrylate | Light Acrylate 1.9ND-A | Kyoeisha Chemical Co., Ltd. |
| DMPAP | 2,2-Dimethoxy-2-phenylacetophenone | IRGACURE 651 | Ciba Specialty Chemicals Corporation |
| BHT | 2,6-Di-t-butyl-p-cresol | IONOL | Japan Chemtech Ltd. |
| DBS | Dibutyl sebacate | DBS | Hokoku Corporation |
| LBR-305 | Liquid polybutadiene | Kuraprene LBR-305 | Kuraray Co., Ltd. |
| B-2000 | Liquid polybutadiene | B-2000 | Nippon Petrochemicals Co., Ltd. |

TABLE 3

| | Amount of unsaturated prepolymer composition A [parts by mass] | Amount of unsaturated prepolymer composition B [parts by mass] | D1101 [parts by mass] | TUFPRENE A [parts by mass] | TMPT [parts by mass] | M120 [parts by mass] | NDA [parts by mass] | DMPAP [parts by mass] | BHT [parts by mass] | DBS [parts by mass] | LBR-305 [parts by mass] | B-2000 [parts by mass] |
| --- | --- | --- | --- | --- | --- | --- | --- | --- | --- | --- | --- | --- |
| Photosensitive resin composition 1 | 75 | | | | | 14 | 10 | 0.5 | 0.04 | | | |
| Photosensitive resin composition 2 | 80 | | | | | 9 | 10 | 0.5 | 0.04 | | | |
| Photosensitive resin composition 3 | 84 | | | | | 5 | 10 | 0.5 | 0.04 | | | |
| Photosensitive resin composition 4 | 88 | | | | | 1 | 10 | 0.5 | 0.04 | | | |
| Photosensitive resin composition 5 | | 60 | | | 1 | 22 | | 1 | 1.6 | 20 | | |
| Photosensitive resin composition 6 | | 65 | | | 1 | 22 | | 1 | 1.6 | 15 | | |
| Photosensitive resin composition 7 | | 70 | | | 1 | 22 | | 1 | 1.6 | 10 | | |
| Photosensitive resin composition 8 | | | 40 | | | | 6 | 1.4 | 1.5 | | | 60 |
| Photosensitive resin composition 9 | 60 | | | | | 29 | 10 | 0.5 | 0.04 | | | |

TABLE 3-continued

| | Amount of unsaturated prepolymer composition A [parts by mass] | Amount of unsaturated prepolymer composition B [parts by mass] | D1101 [parts by mass] | TUFPRENE A [parts by mass] | TMPT [parts by mass] | M120 [parts by mass] | NDA [parts by mass] | DMPAP [parts by mass] | BHT [parts by mass] | DBS [parts by mass] | LBR-305 [parts by mass] | B-2000 [parts by mass] |
|---|---|---|---|---|---|---|---|---|---|---|---|---|
| Photosensitive resin composition 10 | | | | 60 | | | | 2 | 0.3 | | | 31 |

TABLE 4

| No. | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Photosensitive resin composition No. | 1 | 2 | 3 | 4 | 5 | 6 | 7 | 8 | 1 | 1 | 1 |
| Nonwoven fabric No. | 1 | 1 | 1 | 1 | 1 | 1 | 1 | 1 | 2 | 3 | 4 |
| Storage elastic modulus (Pa) | 100 | 110 | 123 | 137 | 179 | 240 | 301 | 3979 | 100 | 100 | 100 |
| Elastic recovery rate (%) | 86.5 | 86.5 | 86.5 | 86.5 | 86.5 | 86.5 | 86.5 | 86.5 | 96.8 | 86.2 | 69.2 |
| Loss elastic modulus (Pa) | 86 | 95 | 115 | 131 | 312 | 486 | 529 | 1945 | 86 | 86 | 86 |
| Relief depth (mm) | 2.01 | 2.03 | 1.96 | 2.02 | 1.97 | 1.99 | 2.00 | 2.02 | 2.01 | 2.01 | 2.01 |
| Open depth | B | B | B | A | A | A | B | C | C | B | B |
| Thickness precision | B | A | A | A | A | A | A | C | A | B | B |

TABLE 5

| No. | Example 12 | Example 13 | Example 14 | Example 15 | Example 16 | Example 17 | Example 18 | Comparative Example 1 | Comparative Example 2 | Comparative Example 3 |
|---|---|---|---|---|---|---|---|---|---|---|
| Photosensitive resin composition No. | 1 | 1 | 1 | 1 | 1 | 1 | 1 | 9 | 10 | 1 |
| Nonwoven fabric No. | 5 | 6 | 6 | 6 | 6 | 6 | 6 | 1 | 1 | 7 |
| Storage elastic modulus (Pa) | 100 | 100 | 100 | 100 | 100 | 100 | 100 | 82 | 6246 | 100 |
| Elastic recovery rate (%) | 38.9 | 31.7 | 31.7 | 31.7 | 31.7 | 31.7 | 31.7 | 86.5 | 86.5 | 28.6 |
| Loss elastic modulus (Pa) | 86 | 86 | 86 | 86 | 86 | 86 | 86 | 75 | 2130 | 86 |
| Relief depth (mm) | 2.01 | 2.04 | 0.08 | 0.11 | 0.49 | 10.07 | 10.98 | 2.00 | 2.00 | 1.98 |
| Open depth | C | C | D | C | C | C | D | E | E | E |
| Thickness precision | B | C | D | D | C | D | D | E | E | E |

TABLE 6

| No. | Example 5 | Example 5-2 | Example 5-3 | Comparative Example 4 | Comparative Example 5 |
|---|---|---|---|---|---|
| Photosensitive resin composition No. | 5 | 5 | 5' | 5 | 5 |
| Nonwoven fabric No. | 1 | 1 | 1 | 1 | — |
| Development method | 1 | 2 | 1 | 3 | 4 |
| Open depth | A | A | A | E | A |

TABLE 6-continued

| No. | Example 5 | Example 5-2 | Example 5-3 | Comparative Example 4 | Comparative Example 5 |
|---|---|---|---|---|---|
| Thickness precision | A | B | A | A | A |
| Photosensitive resin composition recovery rate | ⊚ | ○ | ⊚ | ⊚ | X |

The present application is based on Japanese Patent Application No. 2021-164482 filed with the Japan Patent Office on Oct. 6, 2021, the contents of which are incorporated herein by reference.

INDUSTRIAL APPLICABILITY

The method for producing a printing plate according to the present invention has industrial applicability in wide general commercial printing fields.

The invention claimed is:

1. A method for producing a printing plate, comprising:
  molding a photosensitive resin composition that is liquid at room temperature to form a molded photosensitive resin composition;
  exposure by forming a relief by the exposure of the molded photosensitive resin composition; and
  developing by performing development by attaching or adsorbing the photosensitive resin composition of an unexposed portion in the exposure to a development medium, wherein
  a storage elastic modulus of the photosensitive resin composition of the unexposed portion at a development temperature of the developing is 100 Pa or more and 350 Pa or less, and
  the development medium is a wiper having an elastic recovery rate of 40% or more and 99% or less.

2. The method for producing a printing plate according to claim 1, wherein
  the storage elastic modulus of the photosensitive resin composition of the unexposed portion at the development temperature is 100 Pa or more and 250 Pa or less.

3. The method for producing a printing plate according to claim 1, wherein
  a loss elastic modulus of the photosensitive resin composition of the unexposed portion at the development temperature is 90 Pa or more and 500 Pa or less.

4. The method for producing a printing plate according to claim 1, wherein
  the elastic recovery rate of the wiper is 60% or more and 99% or less.

5. The method for producing a printing plate according to claim 1, wherein
  a relief depth of the printing plate is set to 0.1 mm or larger and 10.0 mm or smaller.

6. The method for producing a printing plate according to claim 1, wherein
  the wiper is a nonwoven fabric.

7. The method for producing a printing plate according to claim 1, further comprising:
  recovering the photosensitive resin composition of the unexposed portion attached or adsorbed to the development medium as a photosensitive resin composition for the production of a new printing plate.

8. The method for producing a printing plate according to claim 1, wherein
  the photosensitive resin composition of the unexposed portion attached or adsorbed to the development medium is recovered and used as a photosensitive resin composition for the production of a new printing plate.

9. A printing method comprising:
  producing a printing plate by the method for producing a printing plate according to claim 1; and
  printing by performing printing using the produced printing plate.

10. The method for producing a printing plate according to claim 1,
  wherein the photosensitive resin composition comprises an ethylenically unsaturated compound,
  the ethylenically unsaturated compound comprises an ester compound with a polyhydric alcohol, and
  the ester compound with a polyhydric alcohol is at least one selected from the group consisting of an alkylene glycol, a polyoxyalkylene glycol, a polyalkylene glycol, and trimethylolpropane.

11. The method for producing a printing plate according to claim 10,
  wherein the ester compound with a polyhydric alcohol is the polyoxyalkylene glycol and/or the polyalkylene glycol.

* * * * *